US009698309B2

(12) United States Patent
Cavaco et al.

(10) Patent No.: US 9,698,309 B2
(45) Date of Patent: Jul. 4, 2017

(54) METHOD FOR FABRICATING CMOS COMPATIBLE CONTACT LAYERS IN SEMICONDUCTOR DEVICES

(71) Applicant: IMEC VZW, Leuven (BE)

(72) Inventors: Celso Cavaco, Leuven (BE); Brice De Jaeger, Leuven (BE); Marleen Van Hove, Blanden (BE); Vasyl Motsnyi, Leuven (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 14/989,114

(22) Filed: Jan. 6, 2016

(65) Prior Publication Data

US 2016/0118542 A1   Apr. 28, 2016

Related U.S. Application Data

(63) Continuation of application No. 14/551,398, filed on Nov. 24, 2014, now abandoned.

(30) Foreign Application Priority Data

Dec. 5, 2013   (EP) ..................................... 13195799

(51) Int. Cl.
*H01L 33/40* (2010.01)
*H01L 21/8252* (2006.01)
(Continued)

(52) U.S. Cl.
CPC .......... *H01L 33/40* (2013.01); *H01L 21/3245* (2013.01); *H01L 21/32051* (2013.01);
(Continued)

(58) Field of Classification Search
CPC ............. H01L 21/32051; H01L 21/283; H01L 21/452; H01L 29/66431; H01L 29/66522;
(Continued)

(56) References Cited

U.S. PATENT DOCUMENTS 4,889,831 A   12/1989 Ishii et al.
6,103,543 A   8/2000 Uemura et al.
(Continued)

FOREIGN PATENT DOCUMENTS

CN    102789976 A    11/2012
EP    1 172 867 A2    1/2002
(Continued)

OTHER PUBLICATIONS

Arulkumaran, S., et al., "Demonstration of Submicron-Gate AlGaN-GaN High-Electron-Mobility Transistors on Silicon with Complementary Metal-Oxide-Semiconductor-Compatible Non-Gold Metal Stack", *Applied Physics Express*, Dec. 17, 2012, vol. 6, pp. 016501-1 through 016501-3.
(Continued)

*Primary Examiner* — Matthew Landau
*Assistant Examiner* — Grant Withers
(74) *Attorney, Agent, or Firm* — McDonnell Boehnen Hulbert & Berghoff LLP

(57) ABSTRACT

A method for fabricating Complementary Metal Oxide Semiconductor (CMOS) compatible contact layers in semiconductor devices is disclosed. In one embodiment, a nickel (Ni) layer is deposited on a p-type gallium nitride (GaN) layer of a GaN based structure. Further, the GaN based structure is thermally treated at a temperature range of 350° C. to 500° C. Furthermore, the Ni layer is removed using an etchant. Additionally, a CMOS compatible contact layer is deposited on the p-type GaN layer, upon removal of the Ni layer.

6 Claims, 4 Drawing Sheets

(51) Int. Cl.
| | |
|---|---|
| *H01L 21/3205* | (2006.01) |
| *H01L 21/3213* | (2006.01) |
| *H01L 21/324* | (2006.01) |
| *H01L 29/20* | (2006.01) |
| *H01L 29/45* | (2006.01) |
| H01L 33/32 | (2010.01) |
| H01L 29/207 | (2006.01) |

(52) U.S. Cl.
CPC .... *H01L 21/32134* (2013.01); *H01L 21/8252* (2013.01); *H01L 29/2003* (2013.01); *H01L 29/452* (2013.01); *H01L 33/325* (2013.01); H01L 29/207 (2013.01); H01L 33/32 (2013.01); H01L 2933/0016 (2013.01)

(58) Field of Classification Search
CPC . H01L 29/66446; H01L 29/401; H01L 29/45; H01L 29/47; H01L 29/475; H01L 21/30; H01L 21/28; H01L 21/32134; H01L 21/282–21/288; H01L 27/088; H01L 27/8252
See application file for complete search history.

(56) References Cited

U.S. PATENT DOCUMENTS

| | | | |
|---|---|---|---|
| 6,191,436 B1 | 2/2001 | Shibata et al. | |
| 6,326,294 B1 | 12/2001 | Jang et al. | |
| 7,547,928 B2 | 6/2009 | Germain et al. | |
| 9,184,346 B2* | 11/2015 | Lunev | H01L 33/32 |
| 2002/0000643 A1 | 1/2002 | Uemura et al. | |
| 2002/0142563 A1 | 10/2002 | Sakai et al. | |
| 2002/0146855 A1 | 10/2002 | Goto et al. | |
| 2003/0015794 A1 | 1/2003 | Chang et al. | |
| 2003/0025113 A1 | 2/2003 | Van De Walle | |
| 2003/0025115 A1 | 2/2003 | Uemura et al. | |
| 2003/0183828 A1 | 10/2003 | Lee et al. | |
| 2003/0190764 A1 | 10/2003 | Lee et al. | |
| 2004/0000671 A1 | 1/2004 | Oh et al. | |
| 2004/0026701 A1 | 2/2004 | Murai et al. | |
| 2004/0185643 A1 | 9/2004 | Chiyo et al. | |
| 2004/0222524 A1 | 11/2004 | Song et al. | |
| 2004/0238891 A1 | 12/2004 | Nakamura et al. | |
| 2005/0006229 A1 | 1/2005 | Leem et al. | |
| 2005/0077530 A1 | 4/2005 | Chae | |
| 2005/0082557 A1 | 4/2005 | Seong et al. | |
| 2005/0087753 A1* | 4/2005 | D'Evelyn | C30B 9/00 257/98 |
| 2005/0133803 A1 | 6/2005 | Seong et al. | |
| 2005/0167681 A1 | 8/2005 | Kwak et al. | |
| 2005/0253151 A1 | 11/2005 | Sakai et al. | |
| 2006/0081834 A1 | 4/2006 | Tada et al. | |
| 2006/0081867 A1 | 4/2006 | Kim et al. | |
| 2006/0258156 A1 | 11/2006 | Kittl | |
| 2007/0090388 A1* | 4/2007 | Wang | H01L 24/03 257/103 |
| 2007/0121690 A1* | 5/2007 | Fujii | H01L 33/007 372/43.01 |
| 2008/0006846 A1 | 1/2008 | Ikeda et al. | |
| 2009/0230433 A1 | 9/2009 | Yamaguchi | |
| 2010/0176421 A1 | 7/2010 | Van Hove et al. | |
| 2010/0244097 A1 | 9/2010 | Niiyama et al. | |
| 2010/0258841 A1 | 10/2010 | Lidow et al. | |
| 2011/0140173 A1 | 6/2011 | Ramdani | |
| 2012/0049157 A1 | 3/2012 | Nago et al. | |
| 2012/0319169 A1 | 12/2012 | Van Hove | |
| 2013/0075778 A1* | 3/2013 | Nakanishi | B82Y 20/00 257/99 |
| 2013/0134482 A1* | 5/2013 | Yu | H01L 29/402 257/194 |
| 2013/0168739 A1 | 7/2013 | Kiyama et al. | |
| 2013/0264592 A1 | 10/2013 | Bergmann et al. | |
| 2013/0302930 A1 | 11/2013 | Yeo et al. | |
| 2014/0034980 A1 | 2/2014 | Kazama | |
| 2014/0346568 A1 | 11/2014 | DeJaeger et al. | |
| 2015/0041825 A1* | 2/2015 | Liu | H01L 29/66462 257/77 |
| 2015/0048304 A1* | 2/2015 | Niwa | H01L 33/32 257/13 |
| 2015/0060943 A1 | 3/2015 | Motonobu et al. | |
| 2015/0279961 A1* | 10/2015 | Huang | H01L 29/66204 438/478 |

FOREIGN PATENT DOCUMENTS

| | | |
|---|---|---|
| EP | 1 172 867 A3 | 9/2006 |
| JP | 2005-64485 A | 3/2005 |
| WO | WO 2011/150089 A2 | 12/2011 |

OTHER PUBLICATIONS

Cook, M., "Step Towards Integrating GaN HEMTs and CMOS", *Semiconductor Today Comp. and Adv. Sil.*, Feb. 2013, vol. 8(1), pp. 1-2.

De Jaeger, B., et al., "Au-Free CMOS-Compatible AlGaN/GaN HEMT Processing on 200 mm Si Substrates", *Proceedings of the 2012 24th International Symposium on Power Semiconductor Devices and ICs*, Jun. 3-7, 2012, pp. 49-52, Bruges, Belgium.

Mengzhe, L., et al., "NiO Removal of Ni/Au Ohmic Contact to P-Gan After Annealing" *Journal of Semiconductors*, Feb. 2009, vol. 30(2), pp. 026001-1 through 026001-4.

Wang, G., et al., "Improving P-Type Contact Characteristics by Ni-Assisted Annealing and Effects on Surface Morphologic Evolution of InGaN LED Films Grown on Si (1 1 1)", *Applied Surface Science*, 2011, vol. 257, pp. 8675-8678.

Extended European Search Report, European Patent Office, Application No./Patent No. 14189155.6-1555/2881982, Jul. 24, 2015, pp. 1-9.

Hwang, J.M. et al., "Bias-Assisted Activation of p-GaN at Low Temperatures in Air", Physica Status Solidi (c), vol. 10, Jan. 1, 2004, pp. 2470-2473.

Wang, Guang-Xu et al., "Effects of Ni-Assisted Annealing on p-Type Contact Resistivity of GaN-Based LED Films Grown on Si (111) Substrates", Acta Physica Sinica, vol. 60, No. 7, Jul. 1, 2011, 6 pages.

Hu, C. Y. et al., "Annealing with Ni for Ohmic Contact Formation on ICP-Etched p-GaN", Electronics Letters, vol. 44, No. 2, Jan. 17, 2008, pp. 155-156.

* cited by examiner

US 9,698,309 B2

METHOD FOR FABRICATING CMOS COMPATIBLE CONTACT LAYERS IN SEMICONDUCTOR DEVICES

CROSS-REFERENCE

This application is a continuation of U.S. patent application Ser. No. 14/551,398, filed Nov. 24, 2014, which claims priority to EP 13195799.5, filed Dec. 5, 2013, which is incorporated by reference in its entirety.

TECHNICAL FIELD

Embodiments of the present subject matter relate to III-V nitride-based semiconductor devices. More particularly, embodiments of the present subject matter relate to fabricating contact layers in the semiconductor devices.

BACKGROUND

Typically, III-V nitride-based semiconductors are widely used in fabricating semiconductor devices because of their large energy band gap. However, due to the large energy band gap, high contact resistance may be seen between a metal electrode and a semiconductor interface or contact. For example, consider gallium nitride (GaN) including a p-type GaN layer having magnesium (Mg) dopants that form Mg—H complexes with hydrogen. In this case, the Mg—H complexes lead to passivation of the Mg dopants, which results in high contact resistance between the metal electrode and the contact of the p-type GaN layer.

Additionally, wider market adoption of the semiconductor devices may depend on the fabrication cost. To reduce the fabrication cost, contacts used in the semiconductor devices may need to be made compatible with complementary metal oxide semiconductor (CMOS) fabrication technology. Existing method for fabricating CMOS compatible contacts includes usage of aluminum (Al), which is a CMOS compatible material. However, Al has bad adhesion to the p-type GaN layer. Another existing method for fabricating CMOS compatible contacts includes fabricating an interfacial layer of metals with high work function on the p-type GaN layer. However, even with the presence of the interfacial layer the contacts may have poor electrical characteristics and may not be CMOS compatible.

SUMMARY

A method for fabricating Complementary Metal Oxide Semiconductor (CMOS) compatible contact layers in semiconductor devices is disclosed. According to one aspect of the present subject matter, a nickel (Ni) layer is deposited on a p-type gallium nitride (GaN) layer of a GaN based structure. For example, the Ni layer with a thickness of 5 nm to 15 nm is deposited on the p-type GaN layer. The GaN based structure is thermally treated at a temperature range of 350° C. to 500° C. in an oxygen atmosphere, upon the deposition of the Ni layer. Further, the Ni layer is removed using an etchant. Furthermore, a CMOS compatible contact layer is deposited on the p-type GaN layer, upon removal of the Ni layer. For example, the CMOS compatible contact layer is titanium aluminum titanium (TiAlTi).

BRIEF DESCRIPTION OF THE DRAWINGS

Various embodiments are described herein with reference to the drawings, wherein.

The drawings described herein are for illustration purposes only and are not intended to limit the scope of the present disclosure in any way.

DETAILED DESCRIPTION

A method for fabricating complementary metal oxide semiconductor (CMOS) compatible contact layers in semiconductor devices is disclosed. In the following detailed description of the embodiments of the present subject matter, references are made to the accompanying drawings that form a part hereof, and in which are shown by way of illustration specific embodiments in which the present subject matter may be practiced. These embodiments are described in sufficient detail to enable those skilled in the art to practice the present subject matter, and it is to be understood that other embodiments may be utilized and that changes may be made without departing from the scope of the present subject matter. The following detailed description is, therefore, not to be taken in a limiting sense, and the scope of the present subject matter is defined by the appended claims.

In the following detailed description, the term "GaN based structure" refers to a structure including a substrate and a heterogeneous layer stack of gallium nitride (GaN) based materials deposited on the substrate. The heterogeneous layer stack typically includes a p-type GaN layer and an n-type GaN layer deposited on the substrate. Further, the heterogeneous layer stack includes additional layers depending on the semiconductor device, in which the GaN based structure is used. For example, the GaN based structure used in a light emitting diode (LED) includes a substrate and a heterogeneous layer stack including a nucleation layer, a graded intermediate layer, a n-type GaN layer, a multiple quantum well, an electron blocking layer and a p-type GaN layer.

The present invention relates to fabricating a CMOS compatible contact layer on a p-type GaN layer of a GaN based structure. The method includes deposition of a nickel (Ni) layer on top of the p-type GaN layer, followed by thermal treatment in an oxygen ($O_2$) atmosphere. Furthermore, the Ni layer is wet stripped in a solution of sulfuric acid ($H_2SO_4$) and hydrogen peroxide ($H_2O_2$). Finally, the CMOS compatible contact layer (i.e., aluminum (Al) based) is deposited on the p-type GaN layer.

Figure 1:
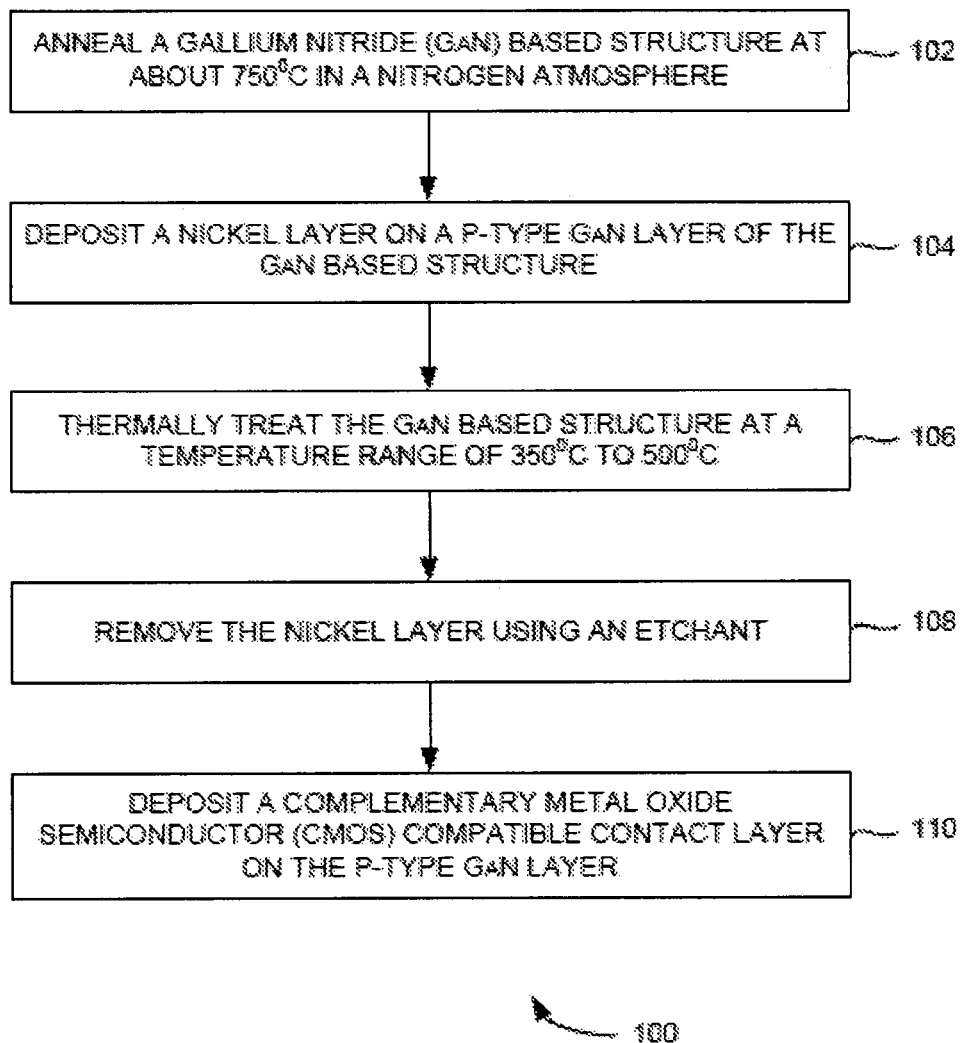
FIG. 1 illustrates a flow chart of an example method for fabricating a complementary metal oxide semiconductor (CMOS) compatible contact layer on a p-type gallium nitride (GaN) layer of a GaN based structure, according to one embodiment.

FIG. 1 illustrates flow chart 100 of an example method for fabricating a CMOS compatible contact layer on a p-type GaN layer of a GaN based structure, according to one embodiment. At step 102, the GaN based structure is annealed at a temperature of about 750° C. in a nitrogen ($N_2$) atmosphere. In one example embodiment, the GaN based structure is annealed in a rapid thermal annealing (RTA) oven for 10 minutes in the $N_2$ atmosphere. By annealing the GaN based structure, dopants (e.g., Mg dopants) in the p-type GaN layer are activated, which in turn increases net hole concentration of the p-type GaN layer.

At step 104, a Ni layer is deposited on the p-type GaN layer of the GaN based structure. For example, the Ni layer includes a thickness ranging from 5 nm to 15 nm. The deposition of the Ni layer on the p-type GaN layer provides better electrical characteristics, such as lower threshold voltage, as explained in detail with reference to FIG. 3. Further, the electrical characteristics also depend on the thickness of the Ni layer, as explained in detail with reference to FIG. 4.

Figure 5:
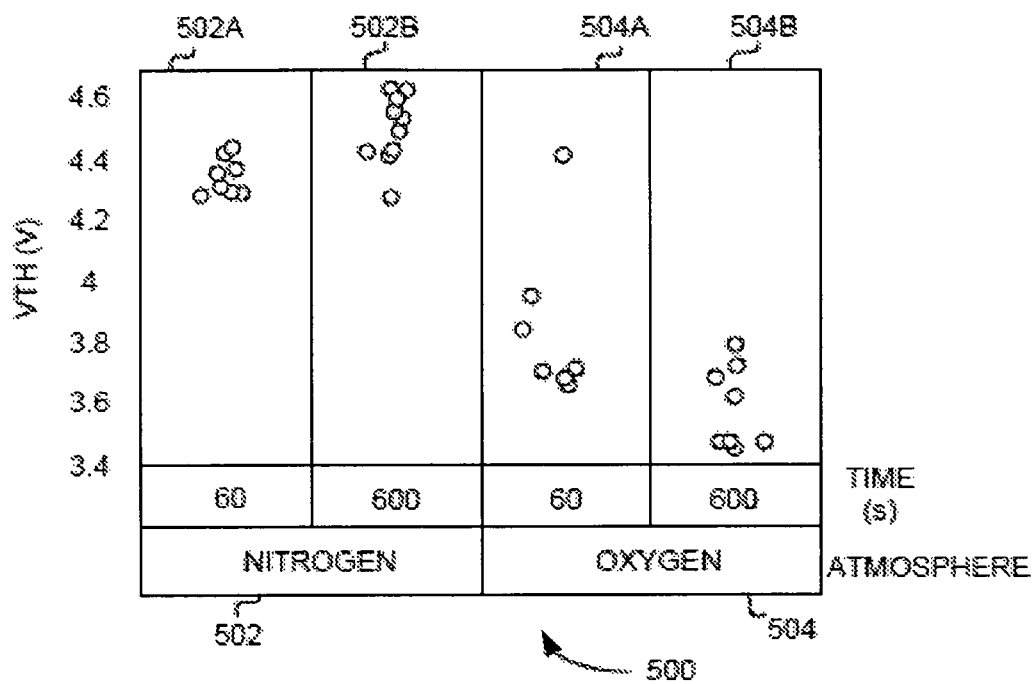
FIG. 5 illustrates a comparative chart, showing a comparison of threshold voltages of the semiconductor devices having the CMOS compatible contact layers fabricated by thermally treating the GaN based structure in different atmospheres and for different time durations.

At step 106, the GaN based structure is thermally treated at a temperature ranging from 350° C. to 500° C. In this case, deposition of additional layers, such as Au or alloys thereof, on the Ni layer is not required. In an example, the GaN based structure is thermally treated at 450° C. in a 100% $O_2$ atmosphere. In another example, the thermal treatment of the GaN based structure is performed for a time period of 60 seconds. Further, FIG. 5 illustrates the improved electrical characteristics of semiconductor devices when the GaN based structure is thermally treated at 450° C. in the $O_2$ atmosphere for 60 seconds.

At step 108, the Ni layer is removed using an etchant. In one embodiment, the Ni layer deposited on the p-type GaN layer is wet stripped using a wet etchant. Examples of wet etchants include, a solution of hydrochloric acid (HCl), nitric acid ($HNO_3$) and water ($H_2O$), a solution of $H_2SO_4$ and $H_2O_2$ (piranha solution) and the like. For example, the Ni layer can be etched for about 2 minutes using the solution of $H_2SO_4+H_2O_2$ to provide better electrical characteristics.

At step 110, the CMOS compatible contact layer is deposited on the p-type GaN layer. For example, the CMOS compatible contact layer includes a multi-layer structure of titanium aluminum titanium (TiAlTi) having a thickness of 1/100/10 nm.

Examples of the semiconductor devices fabricated with CMOS compatible contact layers, include light emitting diodes (LEDs), power devices and the like. In LEDs, the GaN based structure includes a silicon (Si) substrate, an aluminum nitride (AlN) nucleation layer, a graded aluminum gallium nitride (AlGaN) intermediate layer, a Si doped n-type GaN layer, a indium gallium nitride (InGaN)/GaN multiple quantum well, a AlGaN electron blocking layer, and the p-type GaN layer. Further, the GaN based structure is annealed at 750° C. for 10 min in the $N_2$ atmosphere. Then, the Ni layer is deposited on the p-type GaN of the GaN based structure. Furthermore, the GaN based structure is thermally treated in the 100% $O_2$ atmosphere at 450° C. for 60 seconds. Additionally, the Ni layer is etched using the solution of $H_2SO_4+H_2O_2$, in the ratio of 4:1. Thereafter, the CMOS compatible contact layer is deposited on the p-type GaN layer. After deposition of the CMOS compatible contact layer on the p-type GaN layer, a diode mesa structure is defined on the GaN based structure, by means of a chlorine based inductively coupled plasma (ICP) dry etch process. In addition, a contact layer is deposited on the Si doped n-type GaN layer of the GaN based structure.

Figure 2:
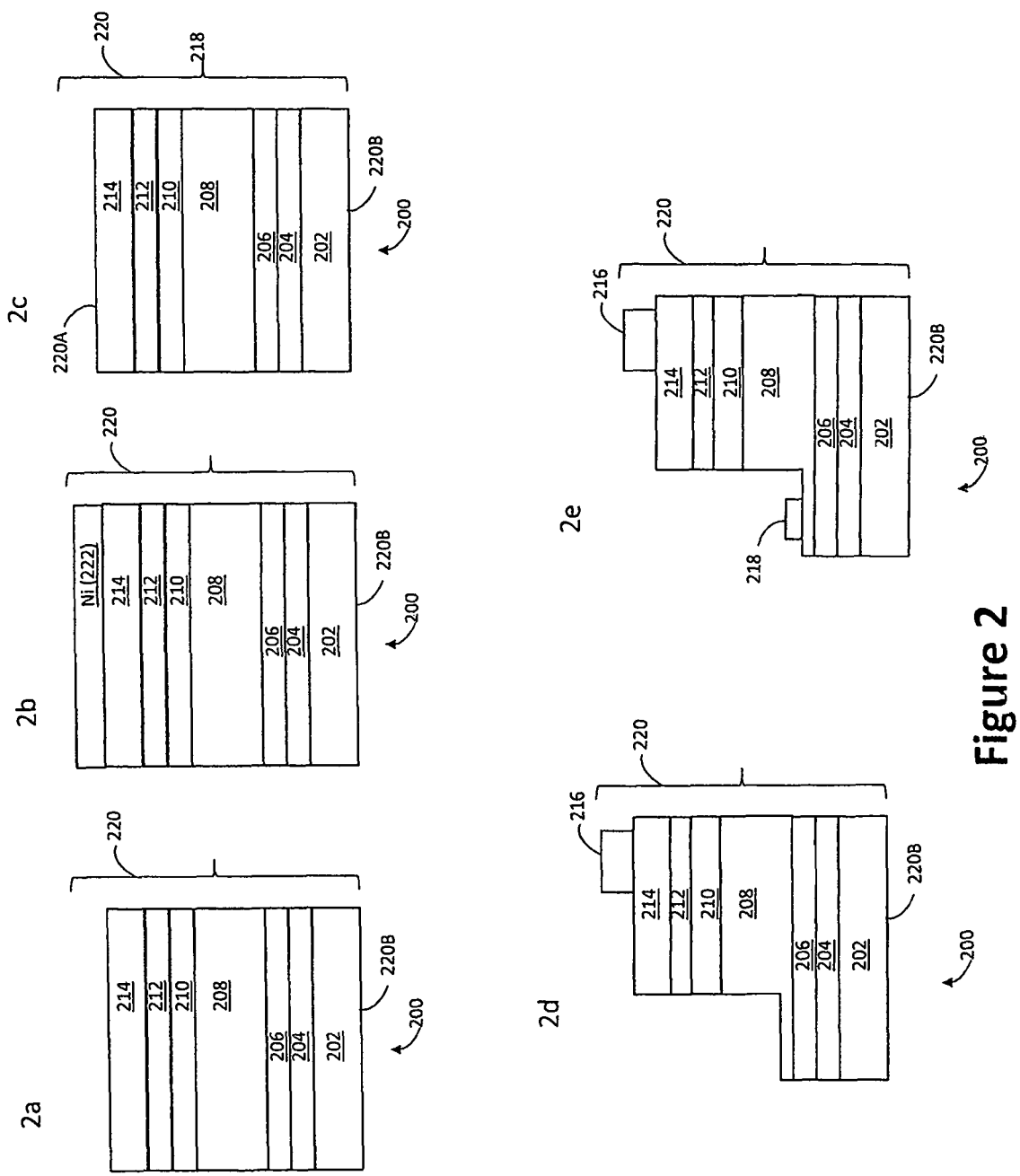
FIG. 2 (parts 2a to 2e) are cross-sectional views of an example GaN based structure having the CMOS compatible contact layer fabricated in accordance with the method described in FIG. 1.

Referring now to FIG. 2 (parts 2a to 2e), which illustrates cross-sectional views of example GaN based structure 220 having CMOS compatible contact layer 216 fabricated in accordance with the method described in FIG. 1. As shown in FIG. 2, GaN based structure 220 includes substrate 202 on which a heterogeneous layer stack of GaN based materials is deposited. In an embodiment, the heterogeneous layer stack is deposited on substrate 202 using a metalorganic vapor phase epitaxy (MOVPE) technique. The MOVPE technique refers to a process of depositing thin layers of atoms of the GaN based materials onto substrate 202. In the MOVPE technique, precursor chemicals (i.e., precursors to the atoms deposited on substrate 202) are vaporized and transported into a reactor together with other gases. In one embodiment, the atoms of the GaN based materials (i.e., atoms of Ga, Al and N) are deposited on a 200 mm Si (111) substrate, using the precursor chemicals trimethylgallium, trimethylaluminum and ammonia, respectively. In this case, trimethylgallium, trimethylaluminum and ammonia are vaporized and transported using hydrogen as a carrier gas, such that the heterogeneous layer stack is deposited on substrate 202.

As shown in FIG. 2, the heterogeneous stack of GaN based materials includes nucleation layer 204, graded intermediate layer 206, n-type GaN layer 208, multiple quantum well 210, electron blocking layer 212 and p-type GaN layer 214. In an embodiment, nucleation layer 204 is composed of AlN and graded intermediate layer 206 is composed of AlGaN. Further, n-type GaN layer 208 is doped with Si dopants and p-type GaN layer 214 is doped with Mg dopants. Furthermore, multiple quantum well 210 has an InGaN/GaN quantum well structure. Additionally, electron blocking layer 212 is composed of Mg doped AlGaN.

Further FIG. 2 (part 2c) shows, GaN based structure 220 having top surface 220A and bottom surface 220B. Top surface 220A is formed by thermally treating a Ni layer 222 (FIG. 2, part 2b) at a temperature range of 350° C. to 500° C. for about 60 seconds and then removing the Ni layer. In one embodiment, the Ni layer has a thickness of 10 nm and is thermally treated at 450° C. for 60 seconds in an $O_2$ atmosphere. Further, the Ni layer is removed using a solution of $H_2SO_4+H_2O_2$.

Furthermore, CMOS compatible contact layer 216 is present on p-type GaN layer 214. See FIG. 2 (parts 2d and 2e). In addition, contact layer 218 is present on n-type GaN layer 208. See FIG. 2 (part 2e). In one embodiment, CMOS compatible layer 216 includes a multi-layer structure composed of TiAlTi, having a thickness of 1/100/10 nm. Additionally, GaN based structure 220 has a mesa structure and is used in the fabrication of LEDs.

Figure 3:
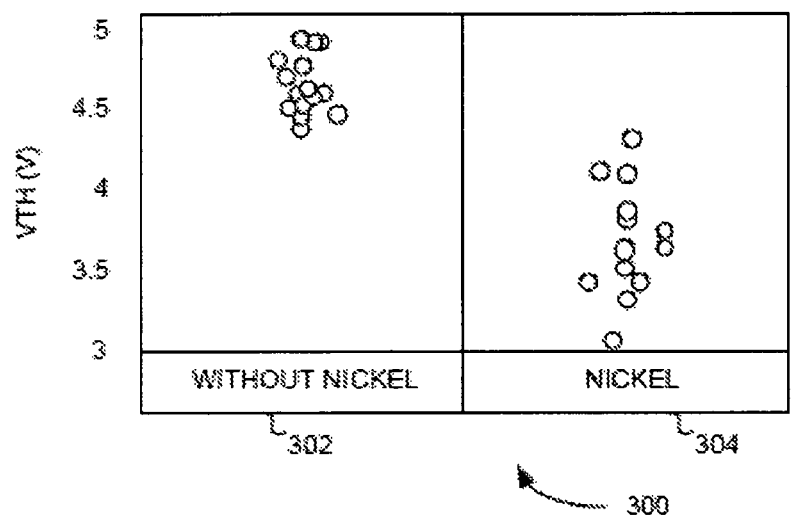
FIG. 3 illustrates a comparative chart, showing a comparison of threshold voltages of semiconductor devices having CMOS compatible contact layers fabricated without and with Ni layer.

Referring now to FIG. 3, which illustrates comparative chart 300, showing a comparison of threshold voltages of semiconductor devices having CMOS compatible contact layers fabricated without and with Ni layer, with threshold voltage shown on y-axis.

According to comparative chart 300, graph 302 illustrates the threshold voltages of semiconductor devices having the CMOS compatible contact layers fabricated without using of the Ni layer. In contrast, graph 304 of comparative chart 300, illustrates the threshold voltages of the semiconductor devices having the CMOS compatible contact layers that are fabricated by using of the Ni layer having a thickness of 10 nm.

As shown in FIG. 3, the threshold voltages in graph 302 are between 4.25 v to 5 v, whereas, the threshold voltages in graph 304 are between 3 v to 4.25 v. From comparative chart 300, it is observed that there is a significant reduction in the threshold voltages when the Ni layer is used. The reduction in the threshold voltages is attributed to improved hole concentration in the p-type GaN layers (e.g., p-type GaN layer 214 of FIG. 2), of the GaN based structures used in the semiconductor devices. For example, referring FIG. 2, the Mg dopants of p-type GaN layer 214 form Mg—H complexes with hydrogen. The deposition of the Ni layer enhances hydrogen desorption from the Mg dopants, which results in improved hole concentration. The improved hole concentration in p-type GaN layer 214 results in the reduction of the contact resistance, which in turn results in the reduction of the threshold voltages of the semiconductor devices. Therefore, better electrical characteristics are achieved when the Ni layer is deposited on the p-type GaN layer 214.

Figure 4:
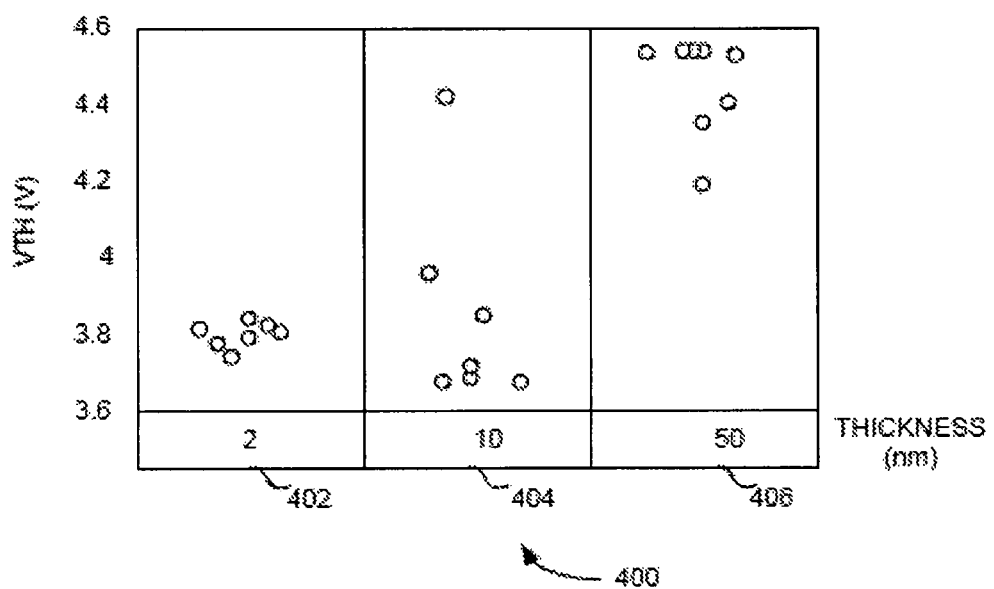
FIG. 4 illustrates a comparative chart, showing a comparison of threshold voltages of semiconductor devices having the CMOS compatible contact layers fabricated using a 2 nm Ni layer, a 10 nm Ni layer and a 50 nm Ni layer, in accordance with the method described in FIG. 1.

Referring now to FIG. 4, which illustrates comparative chart 400, showing a comparison of threshold voltages of semiconductor devices having the CMOS compatible contact layers fabricated using a 2 nm Ni layer, a 10 nm Ni layer and a 50 nm Ni layer, in accordance with the method described in FIG. 1.

According to comparative chart 400, graph 402 illustrates the threshold voltages of the semiconductor devices having the CMOS compatible contact layers fabricated with the 2 nm Ni layer. Further, graph 404 illustrates the threshold voltages of the semiconductor devices having the CMOS compatible contact layers fabricated with the 10 nm Ni layer. Furthermore, graph 406 illustrates the threshold voltages of the semiconductor devices having the CMOS compatible contact layers fabricated with the 50 nm Ni layer. Additionally, threshold voltage is shown on y-axis.

As shown in FIG. 4, the threshold voltages in graph 402 range from 3.75 v to 3.85 v. In contrast, the threshold voltages in graph 404 range mainly from 3.65 v to 3.725 v. Further, as observed in graph 406 the threshold voltages range mainly from 4.535 v to 4.575 v. Therefore, lowest threshold voltage range is observed when the 10 nm Ni layers are used to fabricate the CMOS compatible contact layers.

Referring now to FIG. 5, which illustrates comparative chart 500, showing a comparison of threshold voltages of the semiconductor devices having the CMOS compatible contact layers fabricated by thermally treating the GaN based structure in different atmospheres and for different time durations. As shown in comparative chart 500, graph 502A and graph 502B illustrate the threshold voltages of the semiconductor devices having the CMOS compatible contact layers fabricated in the $N_2$ atmosphere for 60 seconds and 600 seconds, respectively. Furthermore, graph 504A and graph 504B illustrate the threshold voltages of the semiconductor devices having the CMOS compatible contact layers fabricated in the $O_2$ atmosphere for 60 seconds and 600 seconds, respectively.

As observed from FIG. 5, threshold voltage range in graph 502A and graph 502B is mainly between 4.25 v to 4.45 v and 4.4 v to 4.6 v, respectively. In contrast threshold voltage range in graph 504A and graph 504B is mainly between 3.625 v to 3.7 v and 3.4 v to 3.45 v, respectively. Therefore, it is observed that there is a significant reduction in the threshold voltages when the CMOS compatible contact layers fabricated in the $O_2$ atmosphere.

Further from graph 504A and graph 504B, it is observed that lower threshold voltages can be achieved when the thermal treatment step is performed for 600 seconds in the $O_2$ atmosphere. However, it is also observed that there is only a slight increase in the threshold voltage range when the thermal treatment step is performed for 60 seconds in the $O_2$ atmosphere. Further, in light of the considerable reduction in the time duration (i.e., from 600 seconds to 60 seconds), the slight increase in the threshold voltage range is considered to have a negligible impact on the electrical characteristics of the semiconductor devices.

Figure 6:
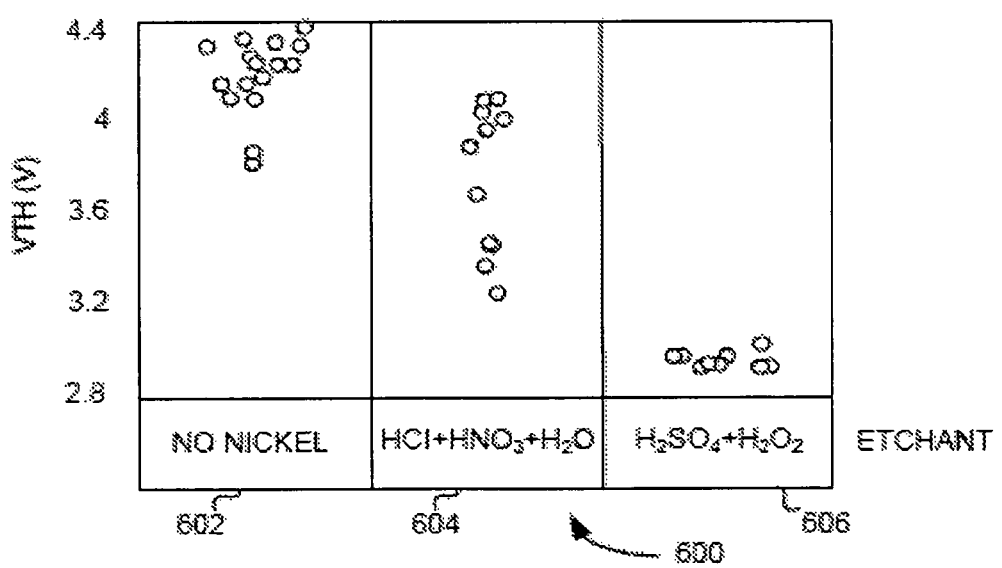
FIG. 6 illustrates a comparative chart, showing a comparison of threshold voltages of the semiconductor devices having the CMOS compatible contact layers fabricated by removing the Ni layer using different etchants, in accordance with the method described in FIG. 1.

Referring now to FIG. 6, which illustrates comparative chart 600, showing a comparison of threshold voltages of the semiconductor devices having the CMOS compatible contact layers fabricated by removing the Ni layer using different etchants, in accordance with the method described in FIG. 1. As shown in FIG. 6, graph 602 illustrates the threshold voltages of the semiconductor devices having the CMOS compatible contact layers fabricated without the Ni layer. Furthermore, graph 604 illustrates the threshold voltages of the semiconductor devices, when the Ni layer is etched for 10 minutes using $HCl+HNO_3+H_2O$ having the ratio of 3:1:2. In addition, graph 606 illustrates the threshold voltages of the semiconductor devices, when the Ni layer is etched for 2 minutes using $H_2SO_4+H_2O_2$.

As shown in graph 602, when the Ni layer is not used to fabricate the CMOS compatible contact layers, threshold voltage range is 3.8 v to 4.4 v. Further with regards to graph 604, it is observed that when the Ni layer is etched using $HCl+HNO_3+H_2O$ the threshold voltages of the semiconductor devices are in the range of 3.2 v to 4.1 v. Furthermore, as shown in graph 606, when the Ni layer is etched using $H_2SO_4+H_2O_2$ the threshold voltages of the semiconductor devices are in the range of 2.9 v to 3 v. Therefore, it is observed that there is a significant drop in the threshold voltages of the semiconductor devices when the Ni layer is etched using $H_2SO_4+H_2O_2$.

As apparent from the above description, the semiconductor devices having the CMOS compatible contact layers fabricated in accordance with the method described in FIG. 1, show better electrical characteristics as compared to the approaches used in the prior art. Further, by using the CMOS compatible contact layers there is a reduction in the cost of fabricating the semiconductor devices. In other words, by using the CMOS compatible contact layers, the economy-of-scale of existing CMOS production lines is effectively used during the fabrication of the semiconductor devices.

It should be understood that the embodiments and the accompanying drawings as described above have been described for illustrative purposes and the present invention is limited by the following claims. Further, this patent covers all methods fairly falling within the scope of the appended claims either literally or under the doctrine of equivalents.

The invention claimed is:
1. A method for fabricating a contact layer on a p-type gallium nitride (GaN) layer of a GaN based structure, the method comprising:
depositing a nickel (Ni) layer on the p-type GaN layer;
thermally treating the GaN based structure at a temperature range of 350° C. to 500° C., upon depositing the Ni layer;
removing the Ni layer using an etchant, upon thermally treating the GaN based structure; and depositing the contact layer on the p-type GaN layer, upon removing the Ni layer, wherein the contact layer comprises a multi layer structure of titanium aluminum titanium (TiAlTi).

2. The method of claim 1, wherein the p-type GaN layer comprises magnesium (Mg) dopants.

3. The method of claim 1, further comprising:
annealing the GaN based structure at about 750° C. in a nitrogen atmosphere, prior to depositing the Ni.

4. The method of claim 1, wherein thermally treating the GaN based structure further comprises: thermally treating the GaN based structure in an oxygen atmosphere for about 60 seconds.

5. The method of claim 1, wherein the Ni layer comprises thickness of 5 nm to 15 nm.

6. The method of claim 1, wherein the etchant comprises a solution of sulfuric acid ($H_2SO_4$) and hydrogen peroxide ($H_2O_2$).

* * * * *